(12) United States Patent
Miyanaga et al.

(10) Patent No.: US 6,624,455 B2
(45) Date of Patent: Sep. 23, 2003

(54) SEMICONDUCTOR DEVICE AND METHOD OF MANUFACTURING THE SAME INCLUDING DRAIN PINNED ALONG CHANNEL WIDTH

(75) Inventors: Akiharu Miyanaga, Kanagawa (JP); Nobuo Kubo, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/278,441

(22) Filed: Oct. 22, 2002

(65) Prior Publication Data

US 2003/0057501 A1 Mar. 27, 2003

Related U.S. Application Data

(62) Division of application No. 09/246,014, filed on Feb. 4, 1999, now Pat. No. 6,486,014.

(30) Foreign Application Priority Data

Feb. 5, 1998 (JP) .............................. 10-039560

(51) Int. Cl.⁷ ................ H01L 29/7694; H01L 31/1062; H01L 31/113; H01L 31/119
(52) U.S. Cl. ............... 257/288; 257/339; 257/345; 257/368; 257/376; 257/402; 257/408
(58) Field of Search ................... 257/288, 339, 257/345, 368, 376, 402, 408, 351, 403, 404

(56) References Cited

U.S. PATENT DOCUMENTS

| | | | |
|---|---|---|---|
| 4,418,094 A | * 11/1983 | See et al. | 438/289 |
| 5,210,437 A | 5/1993 | Sawada et al. | |
| 5,670,392 A | * 9/1997 | Ferla et al. | 437/29 |
| 5,952,699 A | 9/1999 | Yamazaki et al. | 257/404 |
| 6,107,654 A | 8/2000 | Yamazaki | 257/194 |
| 6,111,296 A | 8/2000 | Yamazaki et al. | 257/401 |
| 6,118,148 A | 9/2000 | Yamazaki | 257/327 |
| 6,127,702 A | 10/2000 | Yamazaki et al. | 257/347 |
| 6,184,556 B1 | 2/2001 | Yamazaki et al. | 257/354 |
| 6,198,141 B1 | 3/2001 | Yamazaki et al. | 257/404 |
| 6,232,642 B1 | 5/2001 | Yamazaki | 257/404 |
| 6,329,235 B1 | * 12/2001 | Kuo | 438/238 |

\* cited by examiner

Primary Examiner—John F. Niebling
Assistant Examiner—Ron E. Pompey
(74) Attorney, Agent, or Firm—Fish & Richardson P.C.

(57) ABSTRACT

In a semiconductor device, pining regions 105 are disposed along the junction portion of a drain region 102 and a channel forming region 106 locally in a channel width direction. With this structure, because the spread of a depletion layer from a drain side is restrained by the pining regions 105, a short-channel effect can be restrained effectively. Also, because a passage through which carriers move is ensured, high mobility can be maintained.

28 Claims, 7 Drawing Sheets

SEMICONDUCTOR DEVICE AND METHOD OF MANUFACTURING THE SAME INCLUDING DRAIN PINNED ALONG CHANNEL WIDTH

This is a divisional of U.S. application Ser. No. 09/246,014, filed Feb. 4, 1999 now U.S. Pat. No. 6,486,014.

BACKGROUND OF THE INVENTION

1. Field of the Invention

The present invention relates to a semiconductor device formed using a single crystal silicon substrate, and in particular to the structure of an insulated gate field effect transistor (called "MOSFET" or "IGFET"). More particularly, the present invention relates to a technique by which an effect is exhibited in the case where a fine element whose channel length is 0.3 $\mu$m or less (representatively 0.05 to 0.2 $\mu$m) is manufactured. Also, the present invention is applicable to various semiconductor circuits such as an IC, a VLSI or a ULSI which is structured with an integrated MOSFET.

2. Description of the Related Art

A MOSFET changes the potential of a semiconductor (representatively silicon) interface just under a gate by a gate voltage to on/off-control electron flow or hole flow between a source and a drain.

However, as the channel length of the transistor is made shorter, the source comes in contact with a space-charge region (also called "depletion layer") in the vicinity of the drain. In this situation, although the potential of the semiconductor interface close to the gate is controllable by the gate potential, a potential of a portion deeper from the gate remains high even if the gate voltage is dropped because it is influenced by the drain voltage.

That is, even if the gate voltage is set as 0 V in order to turn off the transistor, a leakage current is allowed to flow through a portion of the semiconductor substrate which is high in potential (a portion where the space-charge region is widened). This is called "short-channel effect" and appears as a phenomenon such as an increase in S value (sub-threshold coefficient) or a drop of a threshold voltage.

As a phenomenon in which the degree of the short-channel effect is large, there occurs punch-through where a current remains flowing. The fined MOSFET is advantageous in low voltage and high speed. In order to succeed in obtaining those advantages, it is essential to restrain the short-channel effect and reduce an on-state resistance.

In order to fine the MOSFET while the short-channel effect is restrained, a scaling method has been proposed by Dennard in 1974. In order to shorten the gate length as the short-channel effect is restrained through this method, the following means are effective.

(1) A gate insulating film is thinned.

(2) A junction depth of a source and a drain is thinned.

(3) The space-charge region width (depletion layer width) is restrained.

As to the means (1), the limited thickness of the gate insulating film is 3 nm at presence. Also, as to the means (2) with respect to the junction depth, although a study is made to devise an ion doping apparatus or to conduct laser doping, there remain various problems in the case of the deep sub-micron size or lower.

The method of (3) is to increase the concentration of the channel forming region as first proposed, that is, channel doping. However, in the formation of the MOSFET with fine dimensions such as 0.18 $\mu$m rule, it is necessary to add impurities of about $1 \times 10^{18}$ atoms/cm$^3$. This causes an on-state current to be remarkably lowered.

As another method, there is proposed a method called "Double implanted LDD" as shown in FIG. 2A. This is of the structure in which slightly weak p-type (p$^-$) regions 203 and 204 are disposed just under n$^-$ regions (LDD regions) 201 and 202 or so as to surround those n$^-$ regions (LDD regions) 201 and 202 by implanting ions. In particular, in the case where those p-type (p$^-$) regions 203 and 204 are disposed so as to surround the LDD region, it may be called "pocket structure".

In addition, there has been proposed a punch-through stopper structure (FIG. 2B) in which a p-type region (p$^-$ region) 206 high in concentration is formed by the substrate in the interior of the substrate at a channel portion. All of those methods are of engineering in a depthwise direction of the substrate or in a direction of the gate (channel) length.

However, the structures mentioned in the above-described conventional examples as shown in FIGS. 2A and 2B suffer from several problems. Because the structure shown in FIG. 2A is of the structure in which the p$^-$ region is disposed just under the drain region (also including the LDD region), the effect of restraining the short-channel effect cannot be expected so much.

Also, the type called "pocket structure" suffers from such a problem that the mobility is deteriorated since carriers (exemplified by electrons) always pass through the p$^-$ before they reach the drain region.

Further, the structure shown in FIG. 2B is designed to control the concentration in the depthwise direction by through-doping after a gate electrode is formed as usual. Accordingly, the structure is not preferable in order to enhance the mobility because the crystallinity of the semiconductor layer interface is destroyed in addition that the control of the concentration distribution is very difficult.

SUMMARY OF THE INVENTION

The present invention has been made in order to solve the above problems, and therefore an object of the present invention is to provide a MOSFET that makes it possible to effectively restrain the short-channel effect with a structure high in process controllability.

In order to achieve the above object, according to the present invention, a basic structure is that an impurity region for restraining the short-channel effect is locally (at one or several portions) provided in a channel width direction. That is, with the formation of a high-resistant region of the conductive type opposite to that of the source and the drain in the channel width direction, the spread of the space-charge region (depletion layer) from the drain can be restrained, and a high on-state current can be obtained.

The engineering in the width direction of the channel is superior to the engineering in the conventional depth or the length direction of the channel in the following points.

(1) The process controllability is facilitated.

(2) Since the space-charge region restraint region and the channel forming region are separated from each other, the impurity concentration within the reverse layer (channel region) can be lowered (The on-state resistance is decreased to improve the mobility of carriers.).

In the present specification, the space-charge region restraint region (depletion layer restraint region) is directed to an impurity region which is formed in order to restrain the spread of the drain side depletion layer toward the source side. The present inventors call the space-charge region restraint region "pinning region" since the effect of restraining depletion layer looks like pinning the depletion layer.

BRIEF DESCRIPTION OF THE DRAWINGS

Other objects and advantages of the present invention will become apparent during the following discussion conjunction with the accompanying drawings, in which:

FIGS. 1A to 1C are diagrams for explanation of the structure of a MOSFET in accordance with the present invention, in which FIG. 1A is a top view of the structure, FIG. 1B is a cross-sectional view taken along a line A—A of FIG. 1A, and FIG. 1C is a cross-sectional view taken along a line B–B' of FIG. 1A;

DETAILED DESCRIPTION OF THE PREFERRED EMBODIMENTS

Now, a description will be given in more detail of preferred embodiments of the present invention with reference to the accompanying drawings.

(First Embodiment)

Figure 1A:
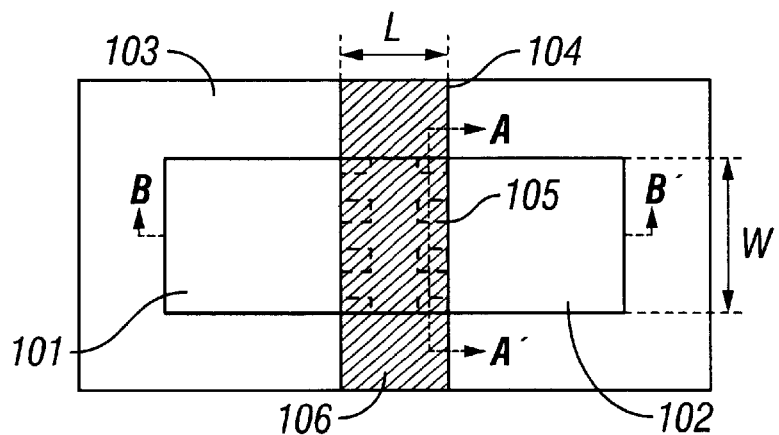
Figure 1B:
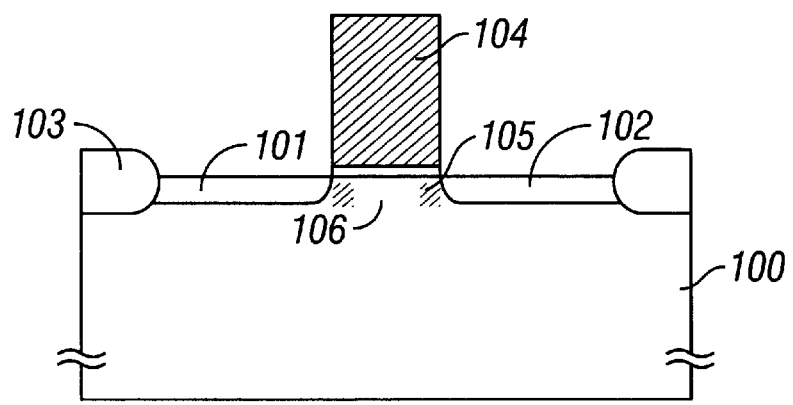
Figure 1C:
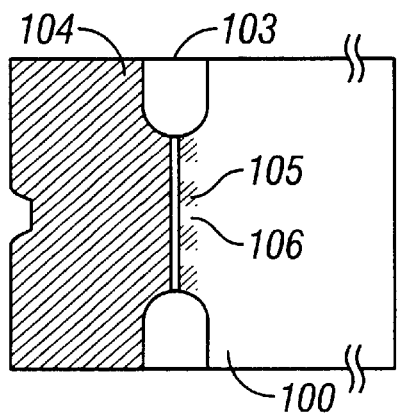
Figure 2A:
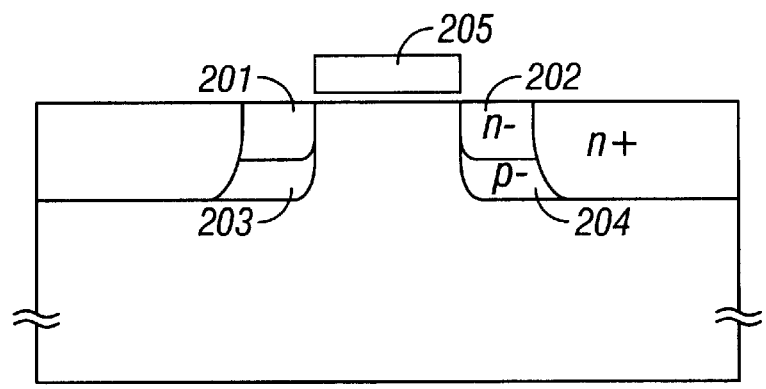
FIGS. 2A and 2B are diagrams for explanation of the structures of a conventional MOSFET, respectively.
Figure 2B:
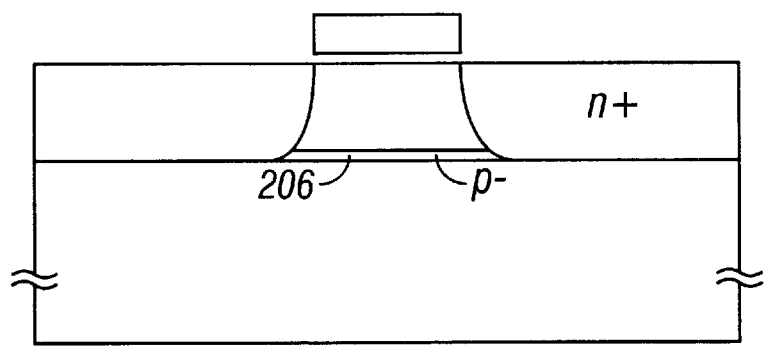

A part of the structure of a MOSFET according to the present invention (source and drain electrodes are omitted therefrom) is shown in FIGS. 1A to 1C. FIG. 1A is a top view of the structure, FIG. 1B is a cross-sectional view taken along a line A—A of FIG. 1A, and FIG. 1C is a cross-sectional view taken along a line B–B' of FIG. 1A.

In FIGS. 1A, 1B and 1C, reference numeral 101 denotes a source region, 102 is a drain region, 103 is a field oxide film, and 104 is a gate electrode. The impurity region 105 formed so as to get under the gate electrode 104 is directed to a pining region which is the feature of the present invention.

In the present specification, although only the source region 101 and the drain region 102 are described, high-resistant regions such as the LDD region and the offset region are also included therein. What is important is a structure in which the pining regions are disposed in the vicinity of the boundary (junction portion) between the channel forming region and the drain region to restrain the spread of the depletion layer, and whether the LDD structure or the offset structure exists, or not, is not important.

Also, in the present specification, the channel forming region is directed to a semiconductor region which is situated under the gate electrode. Since a channel is formed on the semiconductor surface of the pining regions, it is also included in the channel forming region in a broad signification.

Therefore, in the description of the present specification, the channel forming region is classified into the pining regions (impurity regions) 105 and a region into which no impurities have being added (hereinafter referred to as "undoped region") 106. In other words, it may be assumed that the undoped region is a region in which the silicon substrate concentration or the well concentration remains as it is.

The pining regions 105 are formed by the addition of impurities of the conductive type opposite to that of the source/drain regions. Because the width of the depletion layer is determined by a difference in concentration of the p-n junction portion, the spread of the depletion layer can be restrained by forming a region higher in concentration than the channel forming region.

For example, in the formation of the n-channel type MOSFET, in the case where a p-type silicon substrate per se is employed as the channel forming region, the pining regions may be formed by a p-type impurity region higher than the substrate.

In particular, if the channel forming region is of the p-type, the pining regions are formed by addition of elements selected from Group XIII (representatively, boron). Also, if the channel forming region is of the n-type, the pining regions are formed by addition of elements selected from Group XV (representatively, phosphorus or arsenic). It is needless to say that the channel forming region may be formed by use of the silicon substrate or by use of a well formed by the addition of impurities.

The elements selected from the above-described Group XIII or XV form an energy barrier for carriers (electrons or holes) by shifting the energy band of single crystal silicon. From this viewpoint, the pining regions can be called a region formed by shifting the energy band.

A difference in energy as much as the amount by which the band gap is shifted occurs between the undoped region to which no impurities have been added and the pining regions. The potential barrier appears as a difference of the threshold voltage.

The height of the barrier changes depending on the effective carrier concentration (a relative difference in concentration between the n-type and the p-type) but can be adjusted by the concentration of added impurity elements. In the present invention, the concentration of added impurity elements is adjusted within the range of $1\times10^{17}$ to $5\times10^{19}$ atoms/cm$^3$ (preferably, $1\times10^{18}$ to $5\times10^{19}$ atoms/cm$^3$).

The pining regions 105 are disposed at the junction portion of the channel forming region (the semiconductor region just under the gate electrode 104) and the source region 101 or the drain region 102, most representatively as shown in FIG. 1A. That is, the pining regions 105 and the undoped region 106 are alternately disposed in the vicinity of the junction portion.

The cross section of this appearance is shown in FIG. 1B. In this way, a region in which carriers move in priority (undoped region 106) and a region in which the depletion layer is restrained (pining region 105) are separated from each other, a TFT can be operated without any deterioration of the carrier mobility.

In FIG. 1B, what is denoted by reference numeral 100 is a single crystal silicon substrate. This substrate may be of the p-type or the n-type. In the present invention, since the short-channel effect is restrained by the above-described specific structure, in the case where the silicon substrate is employed as the channel forming region, the substrate concentration can be restrained to a lower value of $1\times10^{16}$ to $5\times10^{17}$ atoms/cm$^3$ (preferably, $5\times10^{16}$ to $1\times10^{17}$ atoms/cm$^3$).

Also, if the pining regions are disposed at least on the junction portion at the drain side, the effect of restraining the short channel effect can be obtained. In case of a MOSFET used in a circuit where a source and a drain are specified, the pining regions may be disposed only at the drain side.

The above-described pining regions 105 can be formed by conducting an impurity adding process in a state where a predetermined position is concealed by a resist mask after the gate electrode 104 is formed. In this situation, impurities are added to the gate electrode 104 from an oblique direction, thereby making it possible to form the pining regions 105 which are shaped so as to get under the gate electrode 104 as shown in FIG. 1C.

It is desirable that an oblique angle is 7 to 83° (preferably, 43±3°) with respect to a direction perpendicular to the silicon is substrate. It is not desirable that the oblique angle is 0 to 7° because the occurrence of channeling causes the impurities to be implanted too deeply. Also, when the oblique angle is 83 to 90°, the angle is too shallow, thereby making it difficult to add the impurities under the gate electrode.

In the present embodiment, because the facial orientation of the silicon substrate is (100) face, when the oblique angle is 45° (this means [110] orientation) crystallographically, channeling occurs so that the impurities are implanted most deeply. However, as a result of calculation by the present inventors through simulation, the most preferable angle was 43°. Therefore, in order to implement the present invention, it is desirable that the oblique angle is set as 43±3°.

Also, in this situation, it is desirable that the depth of the formed pining regions 105 is nearly as much as the depth of the junction of the source/drain regions. Accordingly, the depth of the formed pining regions is adjusted so as to be 0.02 to 0.3 μm (preferably 0.05 to 0.1 μm).

The formation of the pining regions 105 requires a very fine processing technology. In the case of using a method of forming a resist pattern to implant impurities through the ion implantation method or the like, a very accurate photolithography is required. Also, it is effective to employ electron drawing at the time of forming a pattern. In addition, the impurities can be added in a maskless manner by use of the FIB (focused ion beam) method.

Figure 3:
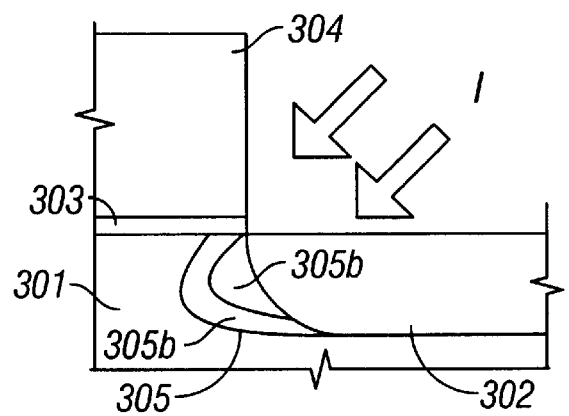
FIG. 3 is a diagram showing the configuration of pining regions.

Also, when the pining regions are formed by adding the impurities from the oblique direction, the pining regions shaped as shown in FIG. 3 are formed. In FIG. 3, reference numeral 301 denotes an undoped region, 302 is a drain region, 303 is a gate insulating film, 304 is a gate electrode, and 305 are pining regions.

With implantation of the impurities from the oblique direction, the pining regions 305 are formed also under the gate electrode 304. In this situation, because the impurities are scattered in formation of the pining regions 305, it is necessary to actually take into consideration a weak impurity region 305b which is formed around the pining region 305a by scattering in design (actually, more continuously complicated distribution is exhibited, however, in this example, it is simplified).

The weak impurity region 305b is caused to reach the semiconductor surface (a portion where the channel is formed). However, since only the impurities which went around the pining region 305a by scattering exist, the effective carrier concentration is about $1\times10^{17}$ to $5\times10^{17}$ atoms/cm$^3$.

In other words, in the conventional MOSFET of 0.2 μm rule, from the viewpoint that the effective carrier concentration in the channel forming region as required is about $1\times10^{18}$ atoms/cm$^3$, it is found that it is a region which sufficiently functions as the channel forming region. Also, because carriers (electrons or holes) pass through a region lower in effective carrier concentration than the conventional structure which has been subjected to channel doping, a higher on-state current as much can be obtained.

The tendency becomes more remarkable if the concentration of impurities in the weak impurity region 305b is restrained to a low value according to the ion implantation conditions. In this way, in the present invention, it may be assumed that all of the semiconductor surface just under the gate electrode is substantially in the channel forming region.

In addition, since the undoped region exists in the form of a slit between the pining regions as shown in FIGS. 1A and 1B, it is presumed that carriers flow there in priority and then reach the drain region.

In other words, in the pocket structure described in the conventional example, the p⁻ region impedes the movement of carriers, whereas the present invention does not suffer from such a problem that the on-state current is lowered since a region that forms a passage through which carriers pass remains.

As described above, the undoped region formed separately from the pining regions connect the source and the drain while the short-channel effect is restrained by the pining regions, the MOSFET of the present invention can maintain a high operation speed.

Figure 4:
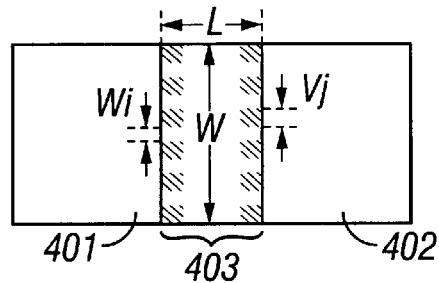
FIG. 4 is a diagram showing the structure in which the pining regions are disposed.

The channel length and the channel width are defined with reference to FIG. 4. In FIG. 4, it is defined that a distance between the source region 401 and the drain region 402 is a channel length (L). The present invention is effective to a fine MOSFET the channel length of which is 0.3 μm or less, representatively, 0.05 to 0.2 μm. Also, a direction along the channel length is called channel length direction.

It is assumed that the length of the channel forming region 403 in a direction orthogonal to the channel length direction is a channel width (W). A direction along the channel width is called "channel width direction".

Although the channel width differs depending on which kind of circuit the device being used as, there is a case where it is set about as long as the channel length, or a case where it is widened to several hundreds μm. For example, the channel width of several hundreds μm is necessary for a circuit that requires a large current to flow such as a buffer circuit or a sampling circuit of a monolithic type LCD.

Also, it is defined that an arbitrary formation width of the pining regions 404 is a pining width (v$_j$). Although the pining width has particularly no upper limit, it is not preferable that the pining width is not ⅓ of the channel width or less since the undoped region of the drain junction portion gets narrow. The lower limit of the pining width depends on the limit of the pattern processing accuracy of photolithography. In case of the present invention, the range of 0.05 to 0.3 μm is a substantial pining width.

In addition, it is necessary that the intervals (w$_i$) between the respective adjacent pining regions are designed so as to be at least twice of the junction depth of the source and the drain.

Since the depth of the pining regions is about as large as the junction depth of the source and the drain, the pattern spreads laterally as large as the junction depth by impurity scattering. That is, unless the intervals which are at least twice of the junction depth are provided at a stage where the pattern of the pining regions is designed, the adjacent pining regions are brought in contact with each other, to thereby cover the undoped region. This is not preferable. Accordingly, in the present invention, $w_i$ is set as 0.04 to 0.6 μm (preferably 0.1 to 0.2 μm).

It is needless to say that it is important to provide an appropriate interval because the pining effect is weakened when the intervals ($w_i$) between the pining regions are too large. The present inventors consider that the upper limit of $w_i$ is a maximum depletion layer width which can be formed with its substrate concentration.

In other words, if the effective carrier concentration of the undoped region is about $1×10^{16}$ atoms/cm$^3$, since the width of the depletion layer to be formed at the drain side is about 0.3 μm, it is preferable that $w_i$ is 0.3 μm or less. Similarly, if the effective carrier concentration is about $1×10^{17}$ atoms/cm$^3$, $W_i$ may be set as 0.1 μm or less. In this way, if the effective carrier concentration of the undoped region (substrate concentration or well concentration) is determined, since the maximum depletion layer width is determined, a design may be made taking such determination into consideration.

In the above way, in the present invention, engineering for restraining the short-channel effect is conducted in the channel width direction. Basically, since impurities are merely added to the gate electrode from an oblique direction, it is facilitated in a process fashion.

What is different from the prior art resides in that with the provision of the impurity region (pining region) locally in the channel width direction when the impurities are added, the short-channel effect can be restrained without lowering the mobility of the MOSFET.

The advantages of the MOSFET according to the present invention will be described below. The first advantage is that the short-channel effect (in particular, punch-through phenomenon) is effectively restrained by the pining regions disposed at the drain junction portion. For that reason, even if fining is progressed according to the scaling rule, an adverse influence due to the spread of the depletion layer can be prevented.

The second advantage is that since the movement of carriers (electrons or holes) during the operation of the MOSFET is made in the undoped region in priority, very high-speed operation can be made. Because the undoped region is a region where the substrate concentration or the well concentration remains as it is, the effective carrier concentration is at least $5×10^{17}$ atoms/cm$^3$ or less (preferably, $1×10^{17}$ atoms/cm$^3$ or less).

For example, in the case where the n-type well having the effective carrier concentration of $1×10^{17}$ atoms/cm$^3$ is formed in a p-type silicon substrate, the concentration of boron in the p-type silicon substrate is about $1 ×10^{16}$ atoms/cm$^3$, boron of about $1×10^{16}$ atoms/cm$^3$ and phosphorous of about 1 to $2×10^{17}$ atoms/cm$^3$ are contained in the n-type well. However, because the scattering of impurities causes any problem when the concentration of impurities becomes $1×10^{17}$ atoms/cm$^3$ or more, boron within the n-type well may be ignored.

Also, in the conventional structure using channel doping, since impurities of about $1×10^{18}$ atoms/cm$^3$ are added over the entire surface of the channel forming region, an influence of impurity scattering becomes very large. In this point, the present invention has such an advantage that an influence of impurity scattering is extremely small even if the influence exists because the effective carrier concentration of the region through which carriers pass in priority (undoped region) is at least $5×10^{17}$ atoms/cm$^3$ or less (preferably, $1×10^{17}$ atoms/cm$^3$ or less).

The third advantage is that, in the structure where the pining regions are disposed at the source region side, the pining regions at the source side can be used as a hole drawing wire. Holes that occur due to the impact ionizing phenomenon of the drain junction portion during the operation of a MOSFET flow toward the substrate, thereby leading to a fear that parasitic bipolar is made conductive.

However, because holes that have moved to the lower portion of the channel by the pining regions disposed at the source side can be drawn to the source region, the withstand voltage between the source and the drain due to conduction of the parasitic bipolar can be prevented from lowering.

In the above manner, because the MOSFET of the present invention can fine the device size while the short-channel effect is restrained, a high operation performance can be realized while maintaining high reliability. In addition, since it is unnecessary to implant surplus impurities in a region where carriers move, the MOSFET having high mobility (field effect mobility) can be realized.

In this embodiment, a description is given with reference to an example of the n-channel type MOSFET. Similarly, the present invention can be applied to the p-channel type MOSFET. In this case, the conductive type of impurities which are implanted in the pining regions is merely changed without any problem.

(Second Embodiment)

In this embodiment, an example in which a CMOS circuit is structured by use of a MOSFET having the structure described in the first embodiment according to the present invention will be described with reference to FIGS. 5A to 5C.

First, a p-type single crystal silicon substrate 501 is prepared, and a p-type well 502 and an n-type well 503 are formed by impurity ion implantation. The structure of this type is of a so-called twin-tab structure in which the well concentration is within the range of $1×10^{16}$ to $5×10^{17}$ atoms/cm$^3$ as described in the first embodiment.

Figure 5A:
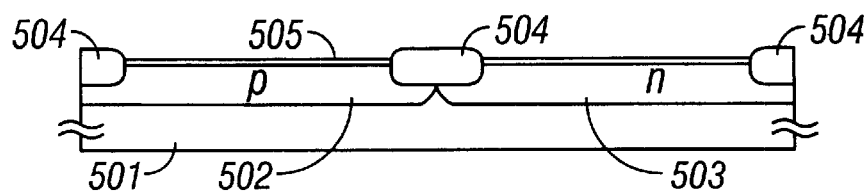
FIGS. 5A to 5C are diagrams showing a process of manufacturing a MOSFET in accordance with the present invention.
Figure 5B:
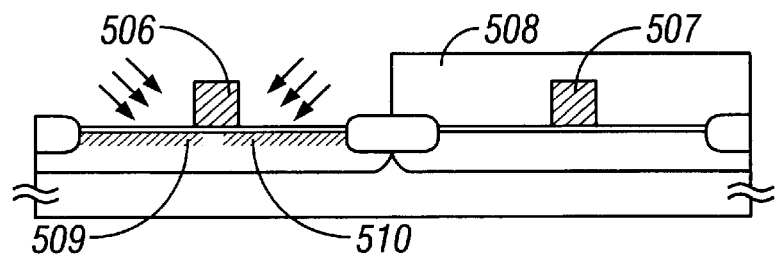

Then, after selective oxidation is conducted through the known LOCOS method to form a field oxide film 504, an oxide film 30 nm in thickness (which will be formed into a gate insulating film later) 505 is formed on the silicon surface through a thermal oxidizing process (FIG. 5A).

Thereafter, gate electrodes 506 and 507 are formed. In this embodiment, a silicon film having conductivity is employed as a material of the gate electrode. However, a conductive film made of tantalum, chromium, tungsten, molybdenum, or the like can be employed instead. In this embodiment, the gate electrode width is set as 0.18 μm.

After the formation of the gate electrode, a region which will be formed into a p-channel type MOSFET later (right side toward the drawing) is covered with a resist mask 508, and elements selected from Group XIII (representatively, boron) is added from an oblique direction in this state.

Figure 8:
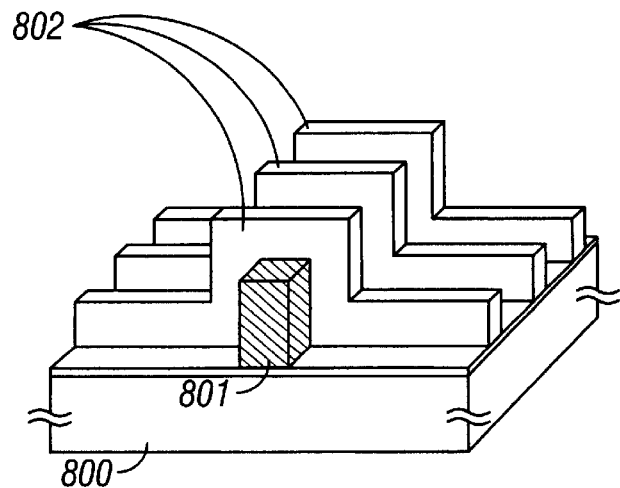
FIG. 8 is a diagram showing an example in which a resist is disposed at the time of forming the pining regions.

Also, a mask for formation of the pining regions is formed in a region which will be formed into an n-channel type MOSFET (left side toward the drawing) together with the resist mask 508. This appearance is shown in FIG. 8. In FIG. 8, reference numeral 800 denotes a silicon substrate, and 801 is a gate electrode.

In this situation, a resist mask 802 is formed in the form of stripes so as to cross the gate electrode 801. In other words, a portion concealed by the mask 802 becomes an undoped region, and an exposed portion (a portion under the gate electrode 801) becomes pining regions.

Since ions are implanted into the impurity region formed in this process within a very narrow area, it is desirable that ions are added by use of a device and conditions which are influenced by impurity scattering as little as possible.

Therefore, in this embodiment, boron is added through the ion implantation method with a concentration of $1 \times 10^{18}$ atoms/cm$^3$. Also, an injection gas is BF$_2$, an accelerating voltage is 30 keV, and the dose amount is $1 \times 10^{13}$ atoms/cm$^2$. Then, adjustment is made so that ions are implanted at an angle of 30° with respect to the silicon substrate.

Figure 10:
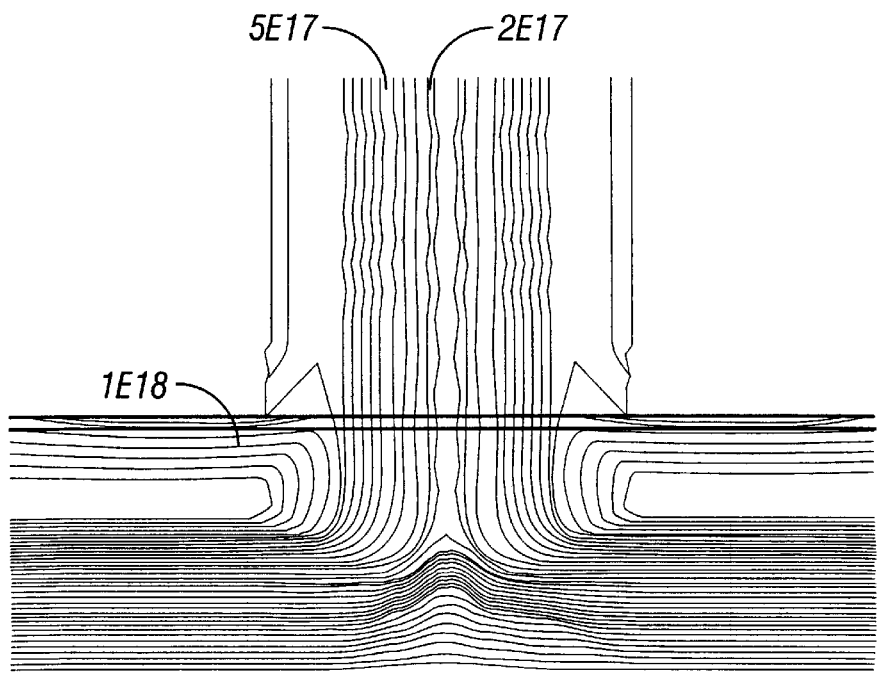
FIG. 10 is a diagram showing a simulation result at the time of forming the pining regions.

The above conditions can be predetermined through simulation. According to the simulation result by the present inventors, it was confirmed that impurities are added with a profile shown in FIG. 10 according to the conditions of this embodiment.

In this way, impurity regions 509 and 510 are formed which will be formed into pining regions later. Actually, only tip portions of those regions 509 and 510 (portions that get under the gate electrode) function as the pining regions (FIG. 5B).

Subsequently, impurity elements selected from Group XV are added perpendicularly with respect to the silicon substrate. In this embodiment, arsenic is used as impurities, and impurity adding conditions are adjusted so that the concentration of impurities becomes $5 \times 10^{18}$ to $1 \times 10^{19}$ atoms/cm$^3$. In this example, in order to form a shallow junction of about 20 to 40 nm, any one of the ion implantation method, the plasma doping method and the laser doping method is used.

Figure 5C:
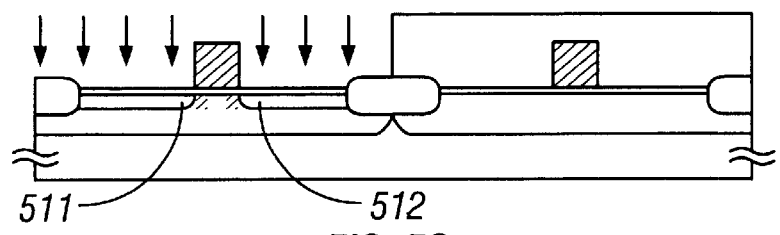

A part of the impurity regions 511 and 512 thus formed functions as the LDD (lightly doped drain) region of the n-channel type MOSFET later (FIG. 5C).

Then, a region which will be formed into an n-channel type MOSFET later is covered with a resist mask 513. In this situation, a mask for forming the pining regions is provided with the structure shown in FIG. 8 in a region which will be formed into the p-channel type MOSFET (not shown).

After the formation of the resist mask 513, elements selected from Group XV (representatively, phosphorus) are added from an oblique direction with respect to the silicon substrate to form impurity regions 514 and 515 which will form the pining regions later. The element addition conditions are determined experimentally through simulation in advance.

Figure 6A:
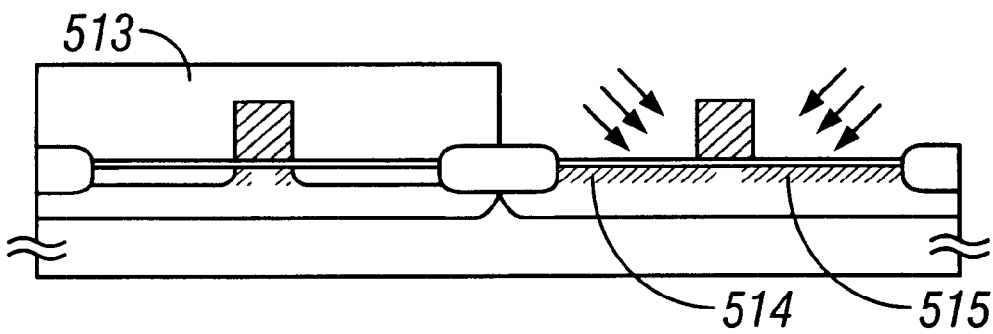
FIGS. 6A to 6C are diagrams showing a process of manufacturing a MOSFET in accordance with the present invention.

In this embodiment, phosphorus of $1 \times 10^{18}$ atoms/cm$^3$ in concentration is added through the ion implantation method. Also, the injection gas is PH$_3$, an accelerating voltage is 30 keV, and the dose amount is $1 \times 10^{13}$ atoms/cm$^2$. Then, adjustment is made so that ions are implanted at an angle of 30° with respect to the silicon substrate (FIG. 6A).

In addition, boron is added vertically with respect to the silicon substrate to form impurity regions 516 and 517 that will function as the LDD region of the p-channel type MOSFET later. Similarly, in this case, it is desirable to form a shallow junction (FIG. 6B).

Figure 6B:
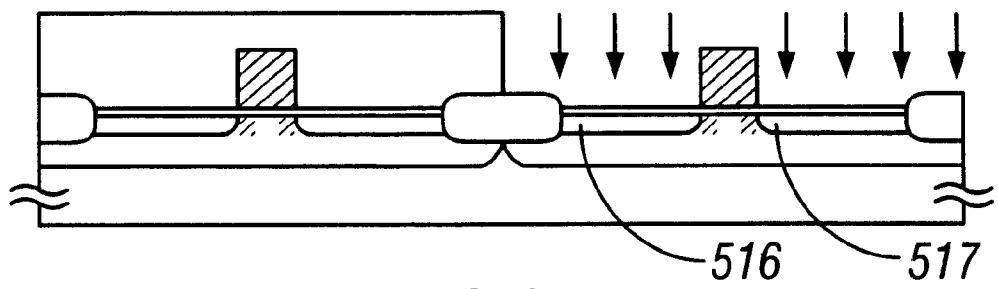
Figure 6C:
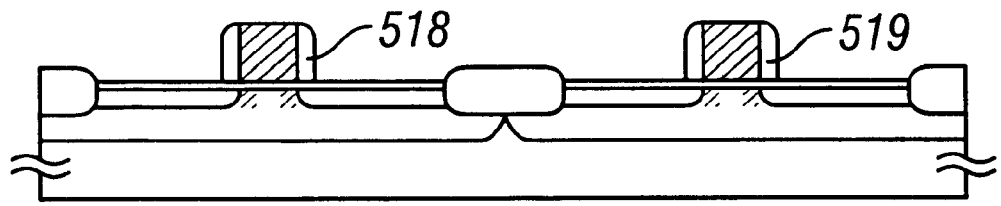

After a state of FIG. 6B has been obtained, a silicon oxide film (not shown) is deposited and subjected to etch back to form side walls 518 and 519 (FIG. 6C).

Figure 7A:
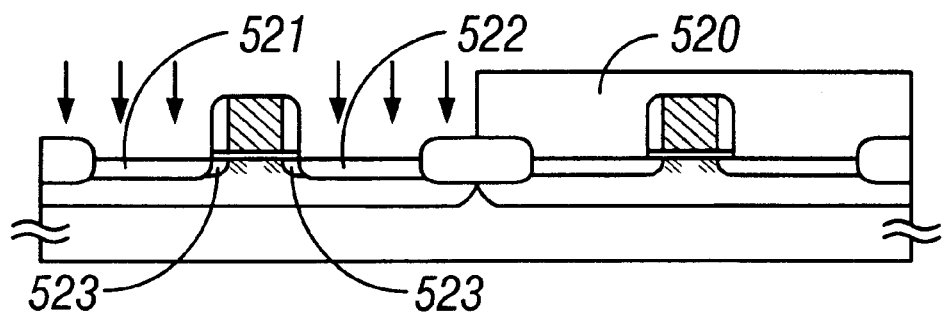
FIGS. 7A to 7C are diagrams showing a process of manufacturing a MOSFET in accordance with the present invention.

Then, a region that will form the p-channel type MOSFET is again coated with a resist mask 520, and arsenic of $1 \times 10^{20}$ atoms/cm$^3$ in concentration is added thereto. A source region 521 and a drain region 522 are thus formed, and an LDD region 523 is formed under the side wall 518 (FIG. 7A).

In the case of forming the source/drain regions, similarly, it is desirable to form a shallow junction by use of any one of the ion implantation method, the plasma doping method and the laser doping method.

Similarly, the region that will form the n-channel type MOSFET is coated with a resist mask 524, and boron of $1 \times 10^{20}$ atoms/cm$^3$ in concentration is added thereto. A drain region 525 and a source region 526 are thus formed, and an LDD region 527 is formed under the side wall 519 (FIG. 7B).

Figure 7B:
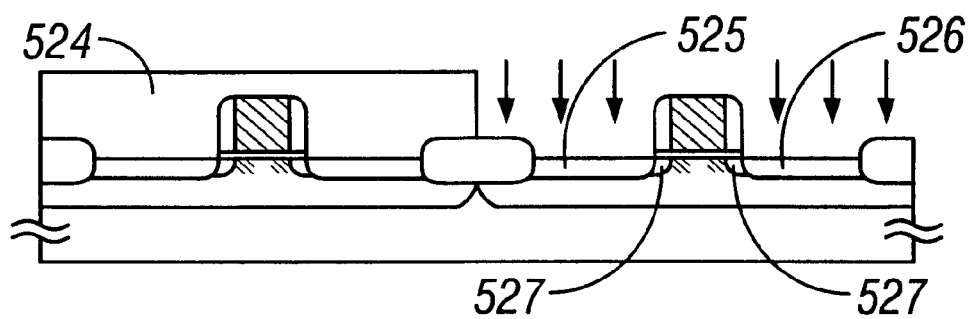

After a state of FIG. 7B has been obtained, an annealing process is conducted due to heat or laser to activate the added impurities. In this situation, it is necessary that conditions are set such that the scattering of impurities is reduced as much as possible.

After the activation of the source/drain regions has been completed, a titanium film is formed and an annealing process is conducted. So, a titanium silicide layer 528 is formed on the surfaces of the source/drain regions and the gate electrode. It is needless to say that a metal silicide using another metal film may be formed. After the silicide layer has been formed, a titanium film is removed.

Subsequently, an interlayer insulating film 529 has been formed, and contact holes are opened to form source electrodes 530, 531 and a drain electrode 532. It is needless to say that it is effective to conduct hydrogenation after the formation of those electrodes.

Figure 7C:
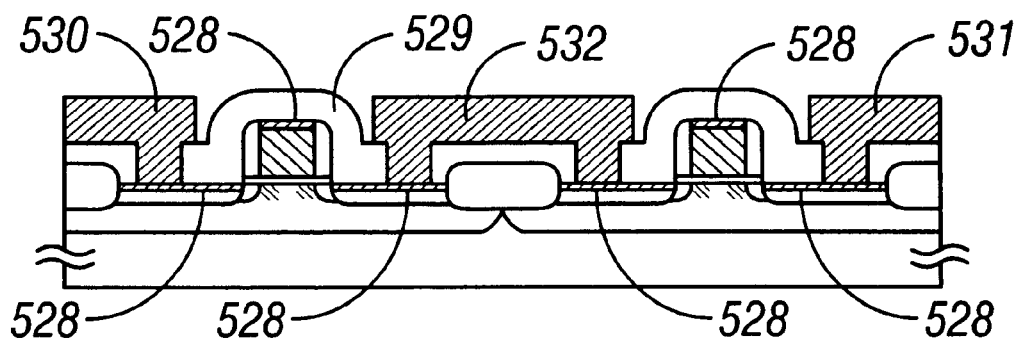

Through the above-described processes, a CMOS circuit shown in FIG. 7C can be obtained. The CMOS circuit has the pining regions with respect to both of the n-channel type and the p-channel type MOSFETs. However, the pining regions may be provided on only any one of those MOSFETs.

(Third Embodiment)

In the first and second embodiments, the pining regions are formed on the source junction portion and the drain junction portion by adding impurities obliquely from both sides of the gate electrode. In this situation, the pining regions disposed on both of the source/drain junction portions may be structured so as to be electrically connected to each other just under the gate electrode.

Figure 9:
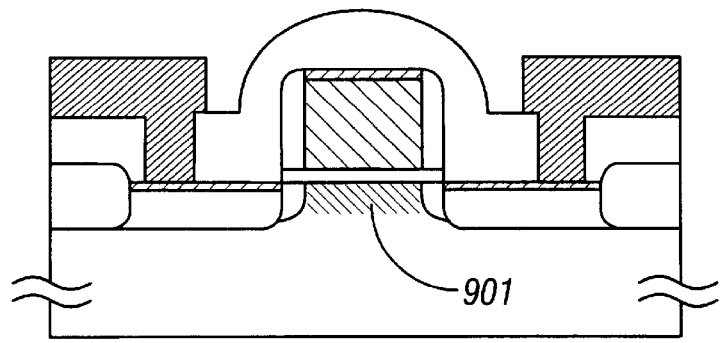
FIG. 9 is a diagram for explanation of the structure of a MOSFET in accordance with the present invention.

The structure of this embodiment is shown in FIG. 9. FIG. 9 shows an n-channel or p-channel type MOSFET having the structure of the present invention. What attention should be paid to is that the pining regions formed by addition of the impurities from the oblique direction comes in contact with each other just under the gate electrode so that one pining region 901 put on the source and the drain is formed.

The pining region 901 is shaped in a slit with respect to the channel width direction as described in FIG. 1, and undoped regions (not shown) are formed between the respective pining regions disposed in the channel width direction.

The structure of this embodiment enhances the pining effect that restrains the spread of the depletion layer from the drain side although an effective area of the undoped region is reduced. If the channel length is caused to be 0.1 µm or less, it is expected that the structure of this embodiment is unavoidably led to from the viewpoint of the controllability of impurity addition.

(Fourth Embodiment)

The present invention can be applied to a buried channel type MOSFET. The channel of the buried channel type is formed lower than the interface with the gate insulating film, and the carriers move thereto.

Accordingly, a carrier mobility by surface scattering does not lower, and high mobility can be obtained compared to a surface channel type. Whereas, the buried channel type has drawbacks such as it is weak in punch-through and low in withstand voltage characteristic.

However, the buried channel type MOSFET adopting the structure of the present invention can restrain the withstand voltage between the source and the drain by punch-through from lowering, maintaining high mobility.

(Fifth Embodiment)

The present invention can be applied to whole conventional IC techniques. That is, the present invention can be applied to all of semiconductor devices (products including a MOSFET as parts) which are on the market at presence. In the present specification, the semiconductor device includes not only elemental devices but also integrated circuits formed of a plurality of elemental devices and electronic devices (applied products) on which those integrated circuits are mounted.

For example, the present invention can be applied to a microprocessor such as an RISC processor or an ASIC processor which are integrated on one chip. Also, the present invention can be applied to all of integrated circuits that employ semiconductor including a signal processor such as a D/A convertor and a high-frequency circuit for a portable device (portable telephone, PHS, mobile computer).

Figure 11A:
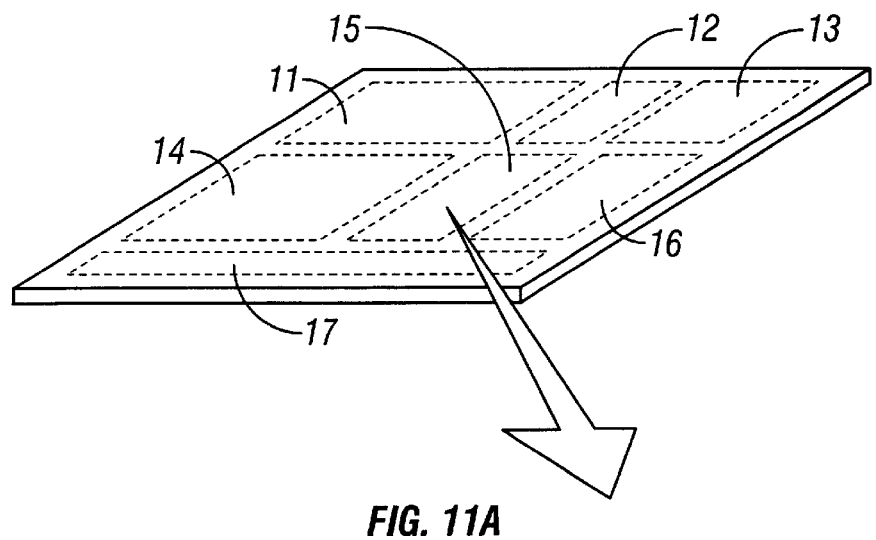
FIGS. 11A to 11C are diagrams showing one example of an electronic device.

What is shown in FIG. 11A is an example of microprocessors. The microprocessor is representatively made up of a CPU core 11, a RAM 12, a clock controller 13, a cash memory 14, a cash controller 15, a serial interface 16, an I/O port 17, etc.

The microprocessor shown in FIG. 11A is one simplified example, and an actual microprocessor is variously designed the circuit depending on its application.

Figure 11B:
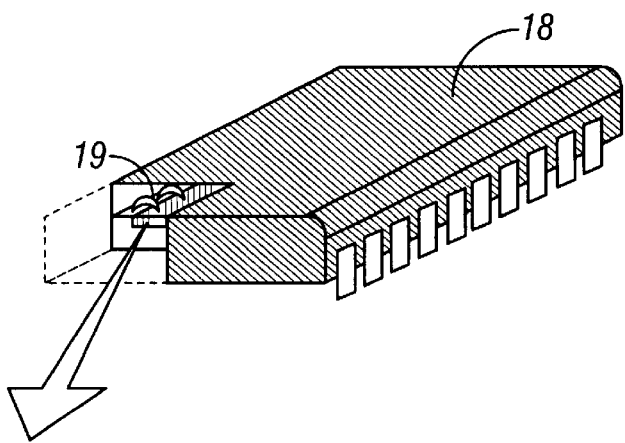

However, even if the microprocessor has any kind of functions, an IC (integrated circuit) 18 functions as its center circuit. The IC 18 is a functional circuit resulting from protecting an integrated circuit formed on a semiconductor chip 19 with ceramic or the like as shown in FIG. 11B.

Figure 11C:
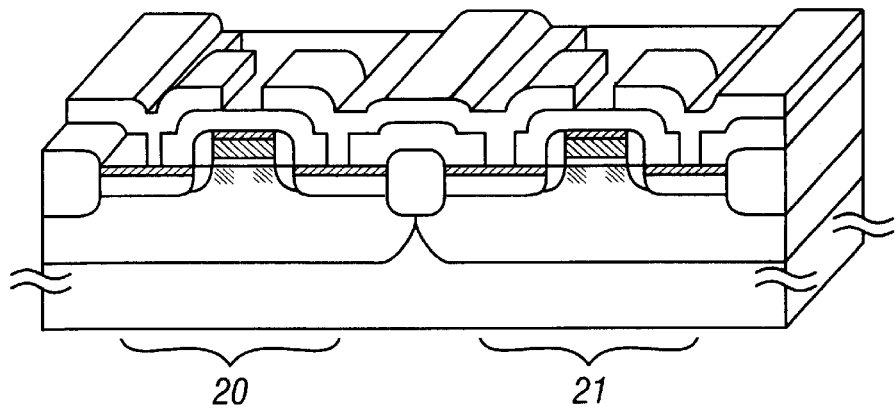

The integrated circuit formed on the semiconductor chip 19 is structured with MOSFETs 20 (n-channel type) and 21 (p-channel type) having the structure of the present invention as shown in FIG. 11C. The basic circuit can restrain power consumption by structuring a CMOS circuit as the minimum unit.

Also, the microprocessor described in this embodiment is mounted on a variety of electronic devices and functions as a center circuit. Representative electronic devices include a personal computer, a portable information terminal device and other various electric household appliances. Also, the electronic devices include a control computer for a vehicle (automobile, electric train, etc.).

As was described above, the present invention can provide a MOSFET which is capable of effectively restraining the short-channel effect with a structure high in process controllability, even if a deep submicron process is required.

In addition, since a region that forms a passage through which carriers move is ensured, the MOSFET that restrains the short-channel effect and has high mobility is realized. That is, the present invention can obtain a semiconductor device that realizes high mobility and high reliability at the same time.

The semiconductor device using the present invention can be replaced by all of semiconductor devices (also including applied products) which are on the market at presence, and the high performance and the high reliability of all the semiconductor devices can be realized.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device having a plurality of MOSFETs where a source region, a drain region and a channel forming region are formed in a semiconductor substrate, respectively, wherein impurity regions of a conductive type opposite to that of said source region and said drain region are disposed locally in a channel width direction on a junction portion of said drain region within said channel forming region.

2. A device according to claim 1, wherein each of said impurity regions comprises a region including impurities of the conductive type opposite to that said drain region with a concentration higher than that of a region in which said impurities are undoped in said channel forming region.

3. A device according to claim 1, wherein elements selected from Group XIII and XV are contained with a concentration of $1 \times 10^{17}$ to $5 \times 10^{19}$ atoms/cm$^3$ in said impurity regions.

4. A device according to claim 2, wherein elements selected from Group XIII and XV are contained with the concentration of $1 \times 10^{17}$ to $5 \times 10^{19}$ atoms/cm$^3$ in said impurity regions.

5. A device according to claim 1, wherein elements selected from Group XIII and XV are contained with a concentration of $1 \times 10^{16}$ to $5 \times 10^{17}$ atoms/cm$^3$ in said semiconductor substrate.

6. A device according to claim 2, wherein elements selected from Group XIII and XV are contained with the concentration of $1 \times 10^{16}$ to $5 \times 10^{17}$ atoms/cm$^3$ in said region in which said impurities are undoped.

7. A device according to claim 1, wherein the width of said impurity regions in the channel width direction is set as 0.05 to 0.3 $\mu$m.

8. A device according to claim 1, wherein said impurity regions are disposed at intervals of 0.04 to 0.6 $\mu$m.

9. A semiconductor device having a plurality of MOSFETs where a source region, a drain region and a channel forming region are formed in a semiconductor substrate, respectively, wherein said channel forming region comprises impurity regions and undoped regions; and wherein said impurity regions of a conductive type opposite to that of said source region and said drain region and said undoped regions are alternately disposed on a junction portion of said drain region within said channel forming region along said junction portion.

10. A device according to claim 9, wherein each of said impurity regions comprises a region including impurities of the conductive type opposite to that said drain region with a concentration higher than that of said undoped region.

11. A device according to claim 9, wherein elements selected from Group XIII or XV are contained with a concentration of $1 \times 10^{17}$ to $5 \times 10^{19}$ atoms/cm$^3$ in said impurity regions.

12. A device according to claim 10, wherein elements selected from Group XIII or XV are contained with the concentration of $1 \times 10^{17}$ to $5 \times 10^{19}$ atoms/cm$^3$ in said impurity regions.

13. A device according to claim 9, wherein elements selected from Group XIII or XV are contained with a concentration of $1 \times 10^{16}$ to $5 \times 10^{17}$ atoms/cm$^3$ in said undoped region.

14. A device according to claim 10, wherein elements selected from Group XIII or XV are contained with the concentration of $1\times10^{16}$ to $5\times10^{17}$ atoms/cm$^3$ in said undoped region.

15. A device according to claim 9, wherein the width of said impurity regions in the channel width direction is set as 0.05 to 0.3 μm.

16. A device according to claim 9, wherein said impurity regions are disposed at intervals of 0.04 to 0.6 μm.

17. A semiconductor device having a plurality of MOSFETs where a source region, a drain region and a channel forming region are formed in a semiconductor substrate, respectively, wherein impurity regions of a conductive type opposite to that of said source region and said drain region are disposed locally in a channel width direction on a junction portion of said drain region within said channel forming region, and wherein said semiconductor device is an electric device selected from the group consisting of a personal computer, a portable informing terminal device and a car navigation system.

18. A device according to claim 17, wherein each of said impurity regions comprises a region including impurities of the conductive type opposite to that said drain region with a concentration higher than that of a region in which said impurities are undoped in said channel forming region.

19. A device according to claim 17, wherein elements selected from Group XIII and XV are contained with a concentration of $1\times10^{17}$ to $5\times10^{19}$ atoms/cm$^3$ in said impurity regions.

20. A device according to claim 17, wherein elements selected from Group XIII and XV are contained with a concentration of $1\times10^{16}$ to $5\times10^{17}$ atoms/cm$^3$ in said region in which said impurities are undoped.

21. A device according to claim 17, wherein the width of said impurity regions in the channel width direction is set as 0.05 to 0.3 μm.

22. A device according to claim 17, wherein said impurity regions are disposed at intervals of 0.04 to 0.6 μm.

23. A semiconductor device having a plurality of MOSFETs where a source region, a drain region and a channel forming region are formed in a semiconductor substrate, respectively, wherein said channel forming region comprises impurity regions and undoped regions, wherein said impurity regions of a conductive type opposite to that of said source region and said drain region and said undoped regions are alternately disposed on a junction portion of said drain region within said channel forming region along said junction portion, and wherein said semiconductor device is an electric device selected from the group consisting of a personal computer, a portable informing terminal device and a car navigation system.

24. A device according to claim 23, wherein each of said impurity regions comprises a region including impurities of the conductive type opposite to that said drain region with a concentration higher than that of said undoped region.

25. A device according to claim 23, wherein elements selected from Group XIII or XV are contained with a concentration of $1\times10^{17}$ to $5\times10^{19}$ atoms/cm$^3$ in said impurity regions.

26. A device according to claim 23, wherein elements selected from Group XIII or XV are contained with a concentration of $1\times10^{16}$ to $5\times10^{17}$ atoms/cm$^3$ in said undoped region.

27. A device according to claim 23, wherein the width of said impurity regions in the channel width direction is set as 0.05 to 0.3 μm.

28. A device according to claim 23, wherein said impurity regions are disposed at intervals of 0.04 to 0.6 μm.

* * * * *